United States Patent
King et al.

(10) Patent No.: US 7,038,915 B2
(45) Date of Patent: May 2, 2006

(54) APPARATUS, SYSTEM, AND METHOD FOR ARRAYING ELECTRICAL DEVICES IN A CABINET

(75) Inventors: Allen King, San Jose, CA (US); Davis Qi-Yu Chu, Newark, CA (US); Michael Attmer Lynch, Jr., Hayward, CA (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 10/634,273

(22) Filed: Aug. 5, 2003

(65) Prior Publication Data

US 2005/0030720 A1   Feb. 10, 2005

(51) Int. Cl.
*H05K 5/03* (2006.01)

(52) U.S. Cl. ............... 361/724; 711/112; 361/735; 312/236

(58) Field of Classification Search ........ 361/724–727, 361/679–687, 728–730, 735; 429/97, 100; 711/112; 165/134; 312/223.2, 236
See application file for complete search history.

(56) References Cited

U.S. PATENT DOCUMENTS

| | | | |
|---|---|---|---|
| 5,136,466 A | 8/1992 | Remise et al. | 361/391 |
| 5,506,750 A | 4/1996 | Carteau et al. | 361/685 |
| 5,566,049 A | 10/1996 | Nguyen | 361/685 |
| 5,731,951 A | 3/1998 | Michaud et al. | 361/685 |
| 6,052,278 A | 4/2000 | Tanzer et al. | 361/685 |
| 6,112,276 A | 8/2000 | Hunt et al. | 711/112 |
| 6,257,407 B1* | 7/2001 | Truwit et al. | 206/320 |
| 6,373,693 B1* | 4/2002 | Seto et al. | 361/685 |
| 6,392,875 B1 | 5/2002 | Erickson et al. | 361/683 |
| 6,400,578 B1 | 6/2002 | Chen | 361/829 |
| 6,445,578 B1 | 9/2002 | Bell et al. | 361/685 |
| 6,459,571 B1 | 10/2002 | Carteau | 361/684 |
| 6,535,381 B1* | 3/2003 | Jahne et al. | 361/685 |
| 6,552,909 B1* | 4/2003 | Liebenow | 361/725 |
| 6,906,918 B1* | 6/2005 | Rabinovitz | 361/687 |

FOREIGN PATENT DOCUMENTS

JP        07-219717        8/1995

* cited by examiner

*Primary Examiner*—Hung Van Duong
(74) *Attorney, Agent, or Firm*—Kunzler & Associates

(57) ABSTRACT

A mounting frame located in a computer cabinet equipment drawer can be transitioned to a loading position to receive an electrical device. The mounting frame in the loading position provides ample manipulation space for connecting or removing the electrical device. The mounting frame may also be retracted to an operational position. The retracted mounting frame allows the electrical device to be positioned in a dense array with minimal space between electrical devices. The mounting frame supports positioning a plurality of electrical devices in dense arrays within a computer equipment cabinet equipment drawer while also providing an adequate manipulation space for connecting and removing the electrical devices. The arrangement allows the electrical devices to be hot swappable while still being densely located.

17 Claims, 10 Drawing Sheets

APPARATUS, SYSTEM, AND METHOD FOR ARRAYING ELECTRICAL DEVICES IN A CABINET

BACKGROUND OF THE INVENTION

1. The Field of the Invention

The invention relates to accessing electrical devices in a computer equipment cabinet. Specifically, the present invention relates to devices, methods, and systems for installing and hot swapping an electrical device in a dense array of electrical devices located in a computer equipment cabinet.

2. The Relevant Art

Operational computer and communications equipment is frequently mounted in computer equipment cabinets. The computer equipment cabinets typically conform to industry standards such as those described in the Electronic Industries Association standard EIA-310. Industry standards specify standard cabinet widths and mounting structures for supporting equipment. Industry standards such as EIA-310 also specify several standard heights for cabinet-mounted equipment drawers.

Computer and communications equipment is typically mounted as densely as possible in computer equipment cabinets. Users prefer high equipment density as it increases the efficiency of cable and power interconnections and reduces space requirements. As a result, manufacturers attempt to package their computer and communications equipment in equipment drawers with the minimum possible standard height. For example, equipment conforming to the EIA-310 standard "1U" height is preferred by equipment manufacturers and users because it supports the greatest density in a computer equipment cabinet.

Many electrical devices housed in computer equipment cabinets are designed to be electrically connected to a host system or electrically detached and physically removed from a host system while other electrical devices and the host system are operational. Connecting or removing an electrical device such as a disk drive while other devices are operational is referred to as hot swapping. Hot swapping allows computer and communications equipment users to add, replace, and upgrade components and devices while other devices and the host system are operational. Hot swapping increases the time a host system and associated peripherals are operational, thereby reducing operational costs.

Electrical devices are often positioned in arrays within an equipment drawer to increase the device density. An array may consist of multiple electrical devices in a row or multiple rows of electrical devices. In arrays of electrical devices containing multiple rows, sufficient manipulation space must remain between the rows to allow the connection and removal of an electrical device. However, providing sufficient manipulation space between rows decreases the density of electrical devices in the equipment drawer. Equipment density could be increased if sufficient manipulation space could be provided for hot swapping while the manipulation space is reduced to a minimum after hot swapping is completed.

What is needed is an apparatus, method, and system for mounting electrical devices in a dense array. What is more particularly needed is an apparatus, method, and system for accessing an electrical device in a dense array by providing a manipulation space greater than the space between electrical devices in the array. It would be particularly advantageous if the electrical devices in such an arrangement could be hot swappable.

SUMMARY OF THE INVENTION

The various elements of the present invention have been developed in response to the present state of the art, and in particular, in response to the problems and needs in the art that have not yet been fully solved by currently available computer equipment cabinets. Accordingly, the present invention provides an improved apparatus, method, and system for housing and accessing an electrical device within a computer equipment cabinet.

In one aspect of the present invention, an apparatus for housing and accessing an electrical device mounted in a computer equipment cabinet includes a mounting frame capable of moving to a loading position to provide access to the electrical device. In one embodiment, the mounting frame swivels away from the equipment drawer, exposing a connector for receiving an electrical device. When the mounting frame is moved to the loading position, an electrical device may be easily inserted in or removed from the mounting frame for example when hot swapping a disk drive within an equipment drawer.

The mounting frame also retracts to an operational position within the equipment drawer. The retracted mounting frame supports a dense array of electrical devices with minimal space between rows of the electrical devices. A retracted mounting frame also allows an equipment drawer to satisfy minimum equipment drawer height standards for computer equipment cabinets.

In another aspect of the present invention, a method for housing and accessing an electrical device in a computer equipment cabinet includes moving a mounting frame originally positioned within an equipment drawer to a loading position to receive an electrical device. The electrical device may be removed from or connected to the mounting frame, supporting hot swapping operations. Subsequently, the mounting frame is retracted within the equipment drawer to an operational position.

Various elements of the present invention are combined into a system for housing and accessing a hot swappable electrical device. One or more mounting frames are positioned within an equipment drawer of a computer equipment cabinet. The mounting frame contains a connector that provides electrical connectivity to other devices such as a peripheral or a host. In one embodiment, the mounting frame swivels away from the equipment drawer to a loading position in order to receive an electrical device. By moving the mounting frame to a loading position adequate manipulation space is provided for connecting or removing the electrical device.

The present invention supports a high density of accessible electrical devices within a computer equipment cabinet. A retracted mounting fame positions electrical devices in a dense array with minimal space between devices. Retracted mounting frames also conform to minimum height requirements for standard computer equipment cabinets. Electrical devices on a mounting frame that is moved to a loading position are easily accessible for insertion and removal. The invention allows for hot swapping of devices located in dense arrays. These and other features and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

The present invention has been developed in response to the present state of the art, and in particular, in response to the problems and needs in the art that have not yet been fully solved by current means and methods of organizing electrical devices. Accordingly, it is an overall object of the present invention to provide an apparatus, system and method for housing and accessing an electrical device in a dense array of electrical devices in an equipment drawer that overcome many or all of the above-discussed shortcomings in the art.

Figure 1:
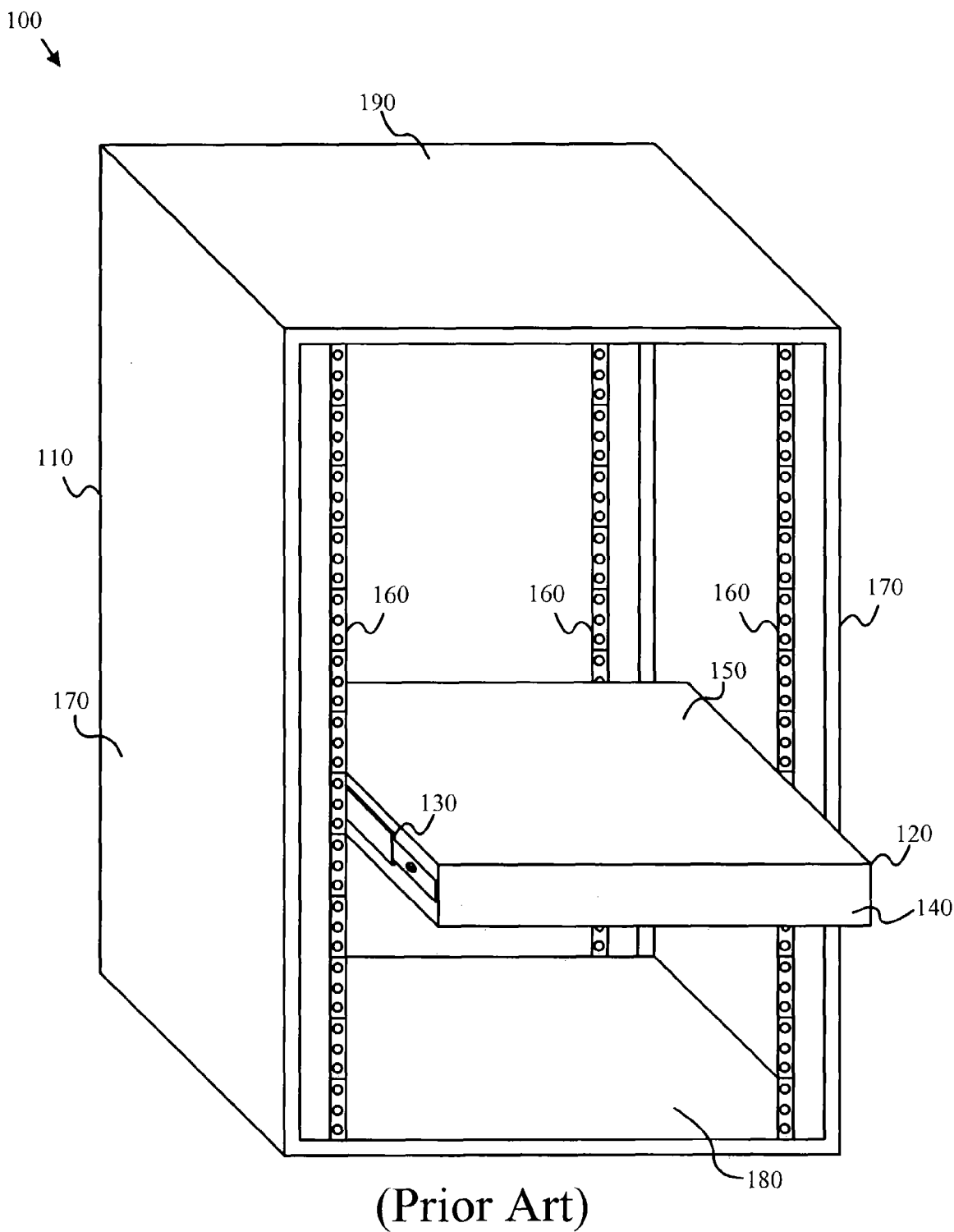
FIG. 1 is a perspective view of a prior art computer equipment cabinet.

FIG. 1 is a perspective view of a prior art computer equipment cabinet 100. The cabinet 100 mounts computer and communications equipment. The cabinet 100 includes a cabinet shell 110, an equipment drawer 120, a sliding support bracket 130, a front panel 140, a top panel 150, one or more mounting brackets 160, one or more cabinet walls 170, a cabinet base 180, and a cabinet top 190.

The cabinet walls 170 are connected to the cabinet base 180. The front of the cabinet shell 110 is open to receive computer and communications equipment. As depicted, the rear of the cabinet shell 110 is also open. In an alternate embodiment, a door is disposed on the rear of the cabinet shell 110. The cabinet top 190 is disposed upon the cabinet walls 170. The mounting bracket 160 is attached to the cabinet wall 170. In one embodiment, the dimensions and specifications of the computer equipment cabinet are specified by the Electronic Industries Association standard EIA-310, which is incorporated herein by reference.

The computer equipment cabinet 100 mounts a plurality of electrical devices. The electrical devices may be any type of computer and communications equipment. Examples of the electrical devices that may be mounted include disk drives, processors, communications equipment, and solid state memory. Equipment may be connected directly to the mounting bracket 160. In one embodiment, the sliding support bracket 130 connects to the mounting bracket 160. The sliding support bracket 130 mounts the equipment drawer 120 within the cabinet shell 110. The sliding support bracket 130 also facilitates the equipment drawer 120 extending from the computer equipment cabinet 110.

In some arrangements, the electrical devices are accessed through the front panel 140 of the equipment drawer 120. In the arrangements, the electrical devices are accessed through the top panel 150 of the equipment drawer 120 as the equipment drawer 120 extends from the cabinet shell 110.

Figure 2:
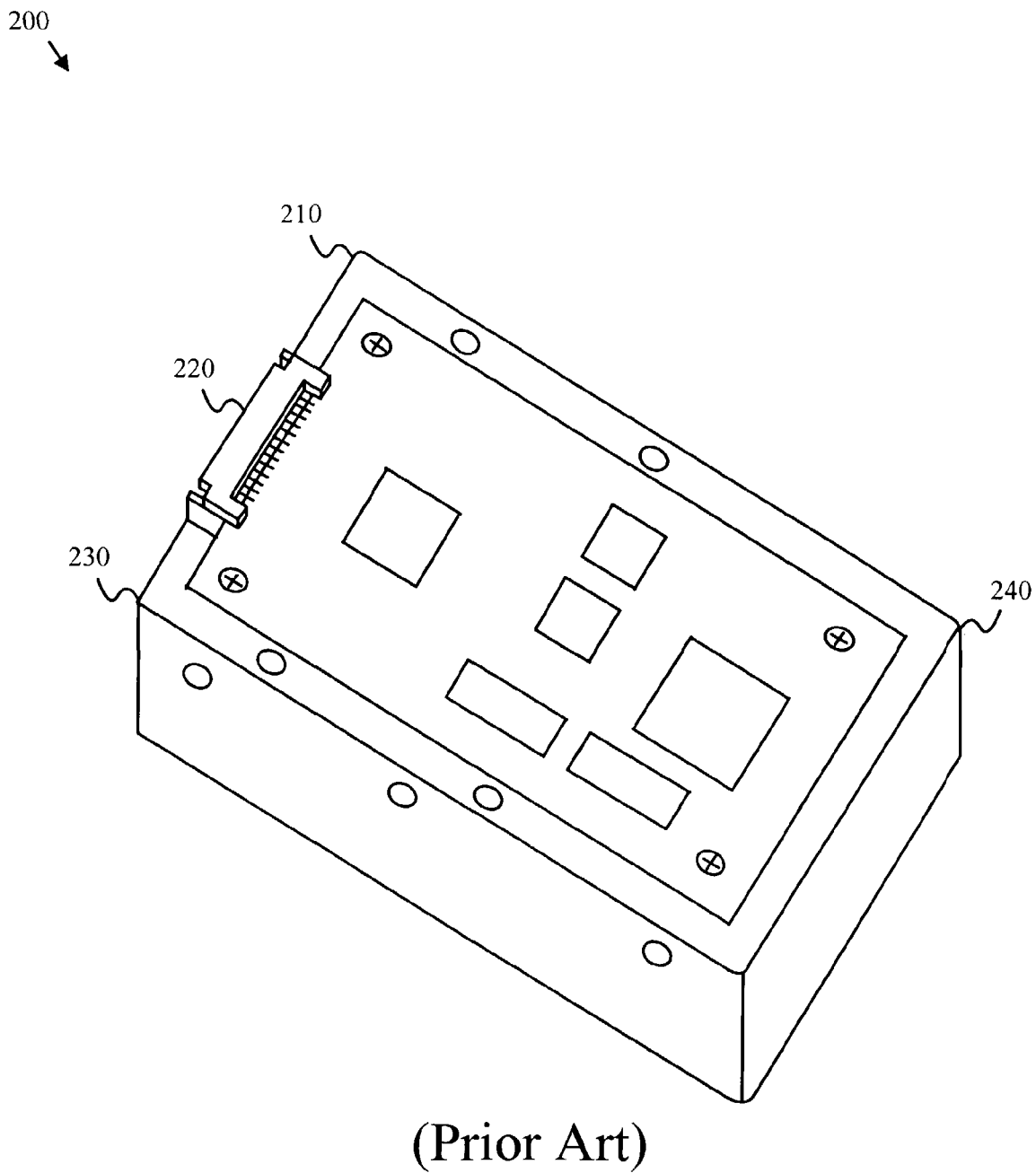
FIG. 2 is a perspective view of a prior art electrical device.

FIG. 2 is a perspective view of a prior art electrical device 200. The depicted electrical device 200 includes a disk drive 210, a connector 220, a distal end 230, and a proximal end 240. The electrical device 200 may be hot swappably connected to or removed from the equipment drawer 120 of a cabinet shell 110. Although for clarity purposes a disk drive 210 is depicted as the electrical device 200, any type of electrical device may be used, including those discussed above.

The connector 220 is mounted on the distal end 230 of the disk drive 210 and connects the electrical device 200 to a connector within the equipment drawer 120. Connecting and removing the disk drive 210 requires a manipulation space adjacent to the device proximal end 240 of the disk drive 210.

Figure 3:
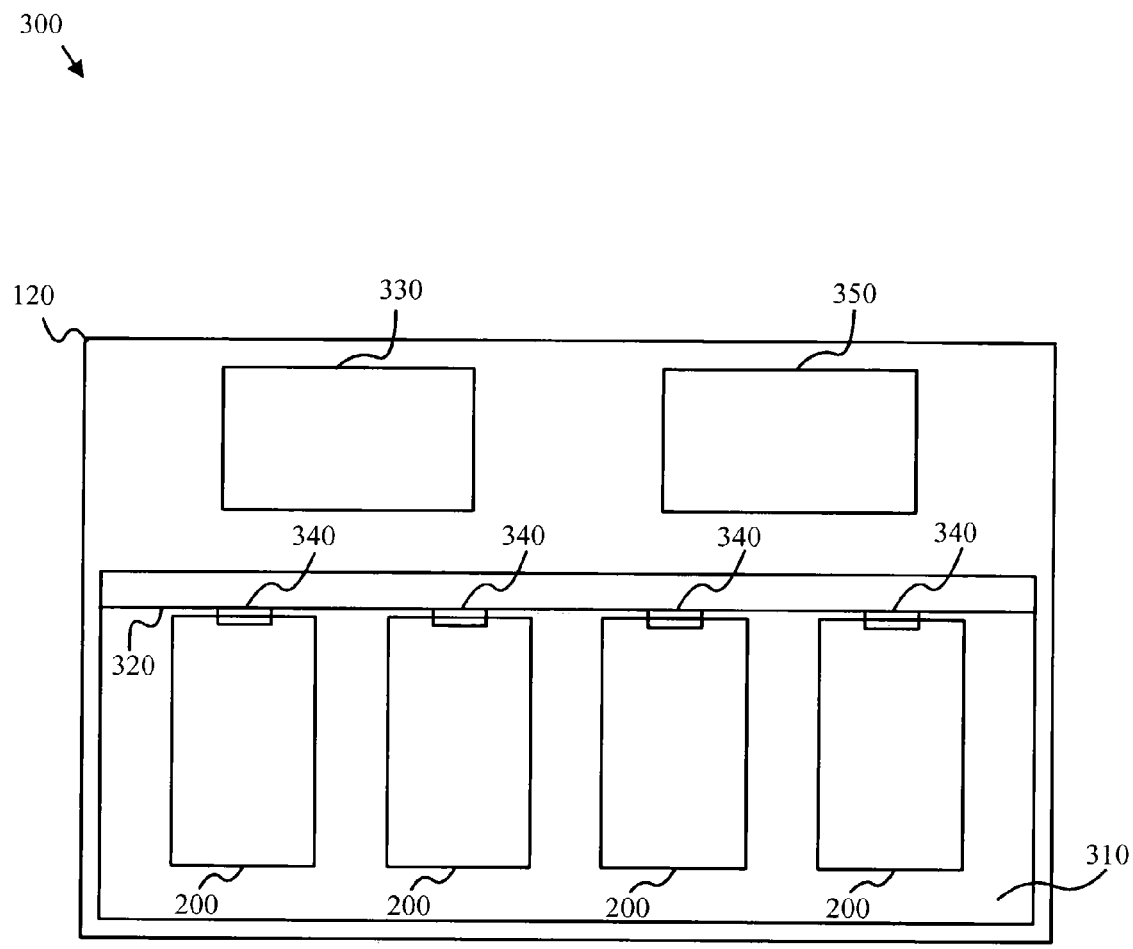
FIG. 3 is an illustration depicting a prior art equipment drawer.

FIG. 3 is an illustration depicting a prior art equipment drawer 300. The equipment drawer 300 provides electrical connectivity between an electrical device 200 and other electrical devices such as a peripheral device and/or a host. In addition to providing electrical connectivity, the equipment drawer 300 also physically mounts the electrical device 200 via a mounting mechanism (not shown).

The depicted equipment drawer 300 includes one or more electrical devices 200, a manipulation space 310, a backplane panel 320, a device controller 330, one or more connectors 340, and a power supply 350. The depicted equipment drawer 300 is one example of the equipment drawer 120 depicted in FIG. 1. In an alternate arrangement, the electrical device 200 is connected or removed through the top panel 150 of the equipment drawer 120 (see FIG. 1).

The equipment drawer 300 houses the electrical devices 200 within the cabinet shell 110 (see FIG. 1). The backplane panel 320 mounts the connector 340. The connector 340 connects the electrical device 200 to the device controller 330. The device controller 330 connects to a host system that may be within the cabinet shell 110. The electrical device 200 may be connected or removed through the front panel 140 of the equipment drawer 120 (see FIG. 1). The power supply 350 supplies power to the electrical device 200.

Connecting and removing the electrical device 200 requires a significant amount of manipulation space 310 adjacent to the device proximal end 240 of the electrical device 200. The manipulation space 310 is adequate provided the electrical device 200 can be placed adjacent to the connector 340 and the electrical device 200 transitioned from the manipulation space 310 to the connector 340.

Figure 4:
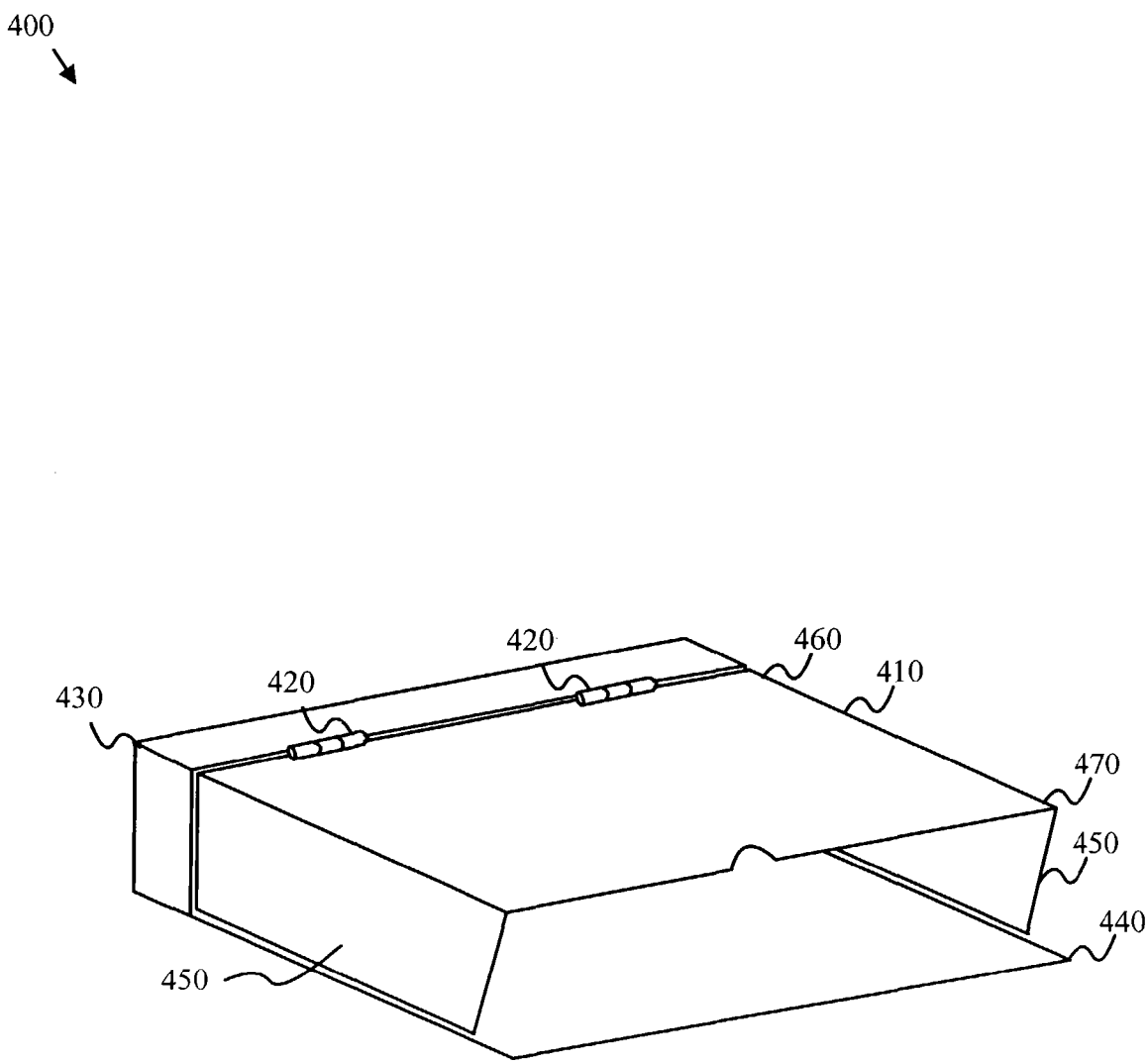
FIG. 4 is a perspective view of one embodiment of a receiving apparatus of the present invention.

FIG. 4 is a perspective view of one embodiment of a receiving apparatus 400 of the present invention. The apparatus 400 provides connectors (not shown) for electrically connecting an electrical device 200 within an equipment drawer 120. The apparatus 400 also includes a mounting frame 410 for physically mounting an electrical device 200, along with one or more movement mechanisms 420, a stationary frame 430, a base 440, one or more side panels 450, a mounting frame distal end 460, and a mounting frame proximal end 470.

The stationary frame 430 resides within the equipment drawer 120 and may be fixably attached to the equipment drawer 120. The stationary frame 430 provides a frame for mounting the movement mechanism 420. As depicted, the movement mechanism 420 is configured to facilitate transitioning the mounting frame 410 between a loading position and an operational position. The movement mechanism 420 is configured to allow the mounting frame 410 to be transitioned between a plurality of functional positions. In the depicted embodiment, the movement mechanism 420 is a hinge and connects to the distal end 460 of the mounting frame 410.

In FIG. 4, the mounting frame 410 is shown in an operational position. The operation position allows the equipment drawer 120 to conform to a minimum height requirement of the computer equipment cabinet 100 when the equipment drawer 120 is retracted within the equipment cabinet 100. The mounting frame 410 is typically in the operation position under normal usage conditions. The movement mechanism facilitates 420 rotating or swiveling the mounting frame 410 from the operation position to a loading position. The side panel 450 protects the electrical devices 200 while transitioning between the operational position and the loading position.

In another embodiment, the movement mechanism 420 is a rail that facilitates vertical movement of the mounting frame 410 between the operational position and the loading position. In the depicted embodiment, the mounting frame 410 is configured to rotate or swivel from the loading position back toward the base 440 into the operational position. The stationary frame 430 may be integral with, or fixably attached to, the base 440. In an alternate embodiment, the stationary frame 430 and the base 440 are components of the equipment drawer 120.

Figure 5:
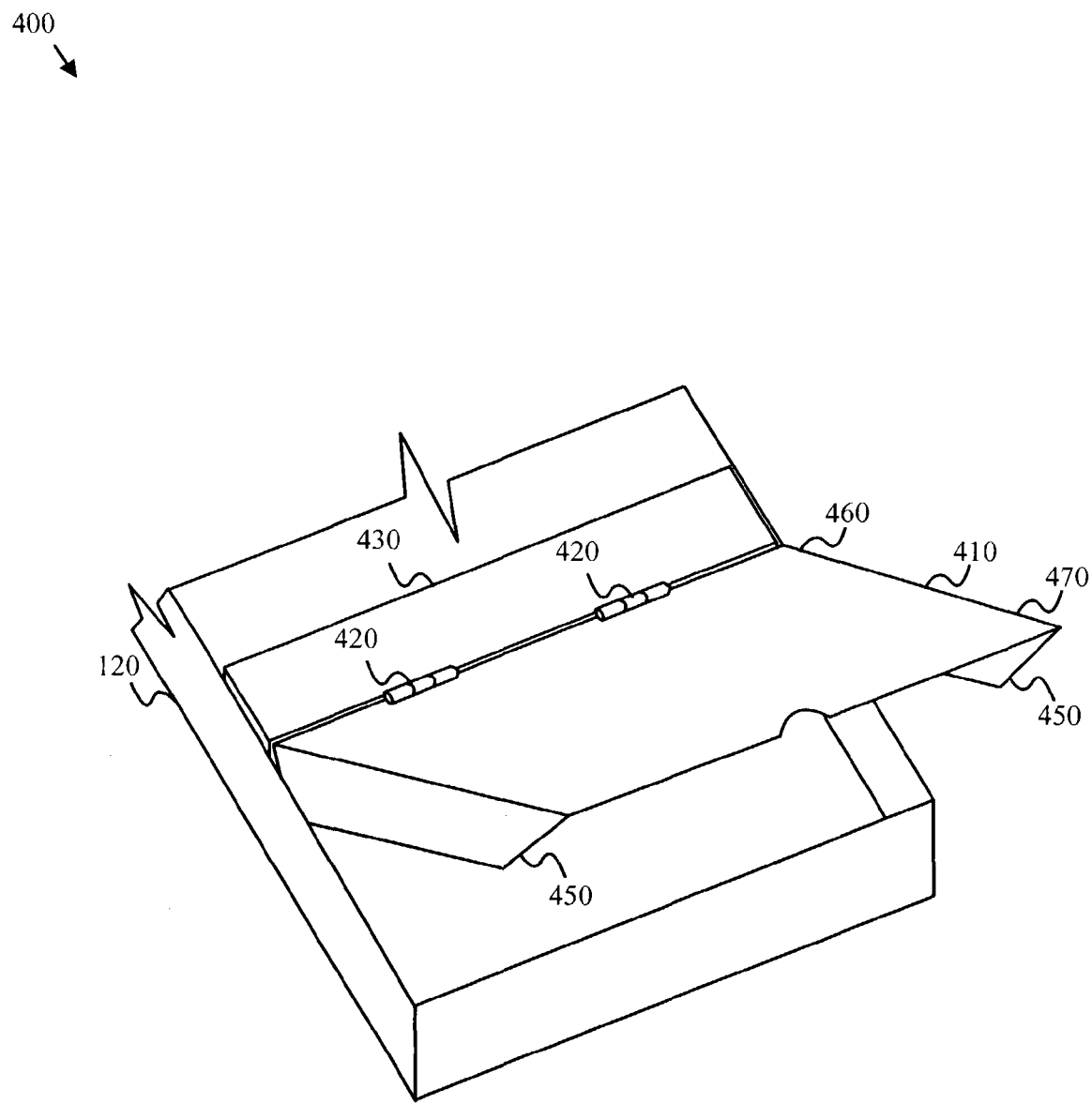
FIG. 5 is a perspective view of one embodiment of a receiving apparatus of the present invention.

FIG. 5 is a perspective view of the receiving apparatus 400 of FIG. 4 shown in the loading position. The loading position disposes the mounting frame 410 at an angle to the equipment drawer. The proximal end 470 of the angled mounting frame 410 is free of obstruction from the equipment drawer 120. The proximal end 470 of the angled mounting frame 410 provides adequate manipulation space to connect and remove the electrical device 200. The side panel 450 protects the electrical device 200 while transitioning between the operational position and the loading position. In one alternate embodiment, the mounting frame 410 has no side panel 450.

Figure 6:
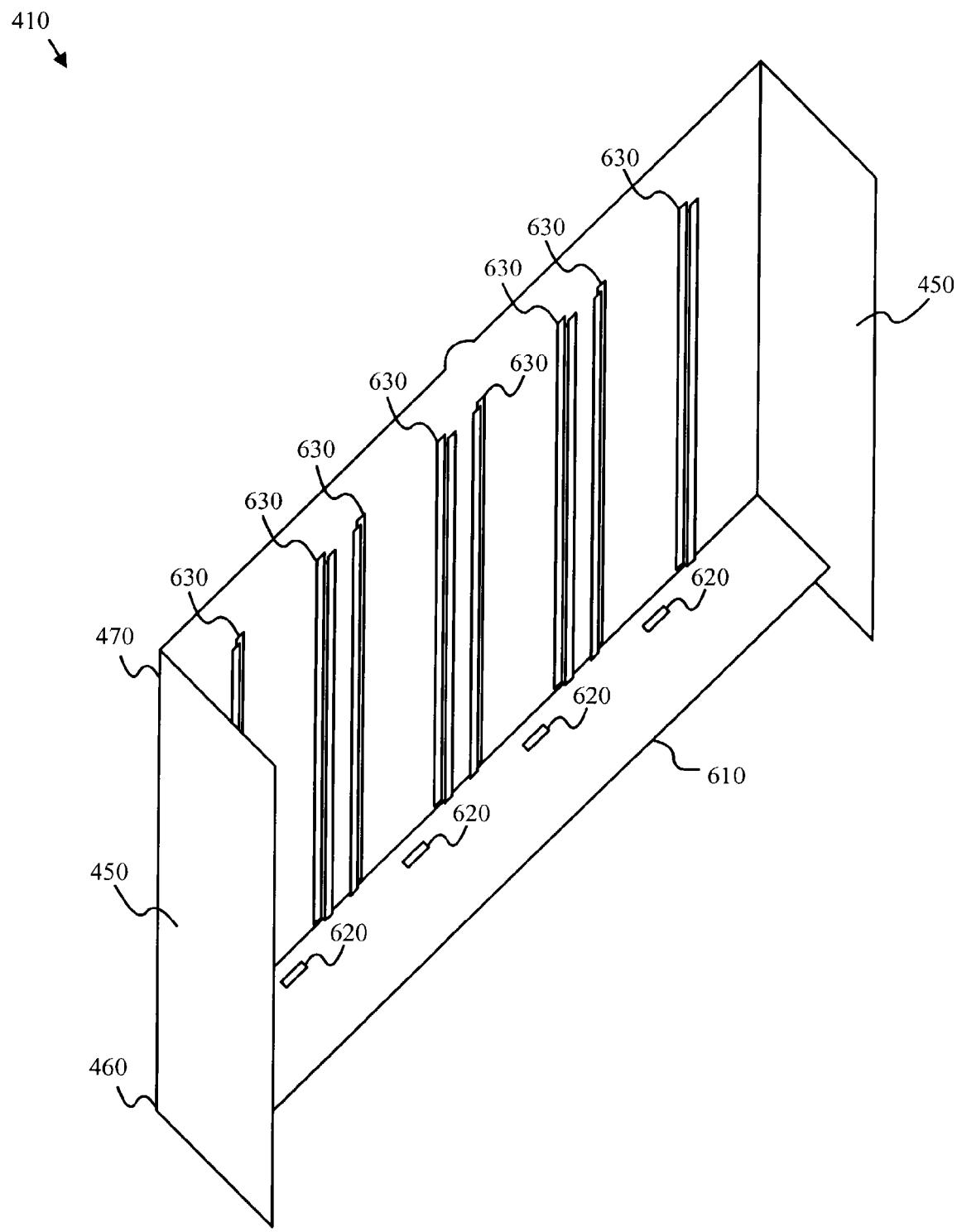
FIG. 6 is a second perspective view the mounting frame of FIG. 5.

FIG. 6 is a perspective view of one embodiment of a mounting frame 410 of the present invention. The mounting frame 410 is preferably configured to physically receive and electrically connect to an electrical device 200. The mounting frame 410 includes one or more side panels 450, a mounting frame distal end 460, a mounting frame proximal end 470, a backplane panel 610, one or more connectors 620, and one or more mounting rails 630. Although for clarity purposes the mounting frame 410 is depicted with four connectors and eight mounting rails, any number of connectors and mounting rails may be employed, and of course, any other suitable mounting mechanism may be used.

In the depicted embodiment, the mounting frame 410 is a plate. The backplane panel 610 is attached to the distal end 460 of the mounting frame 410. The backplane panel 610 transitions with the mounting frame 410 and is provided with a connector 620. The connector 620 connects to an electrical device 200. The mounting rail 630 is attached to the mounting frame 410. The mounting rail 630 is attached to the side of the mounting frame 410 oriented to the equipment drawer 120. The mounting rail 630 is configured to receive and retain the electrical device 200. The mounting rail 630 receives the electrical device 200 from the proximal end 470 of the mounting frame 410. The electrical device 200 transitions from the proximal end 470 to the connector 620 near the distal end 460.

Figure 7:
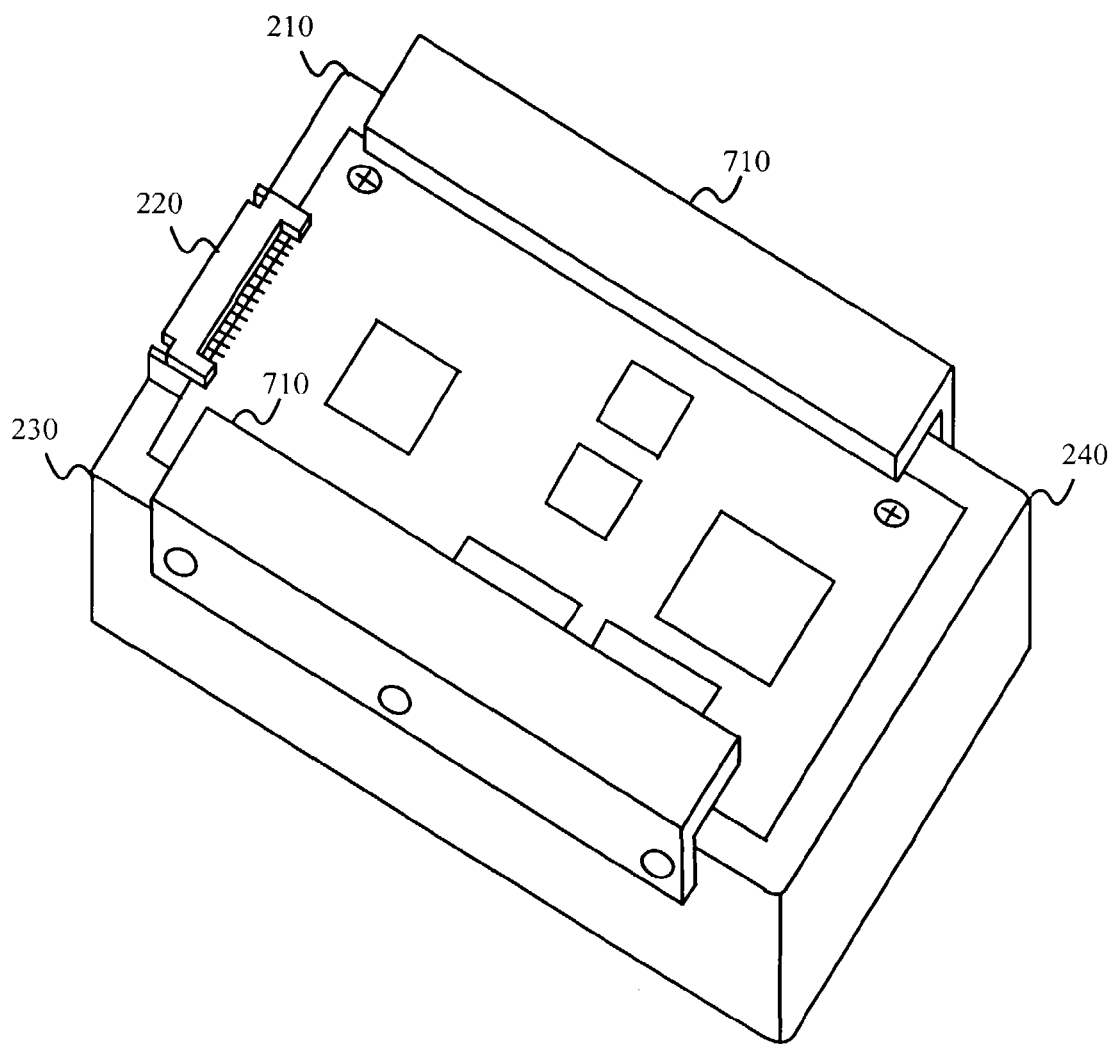
FIG. 7 is a perspective view of one embodiment of an electrical device of the present invention.

FIG. 7 is a perspective view of one embodiment of an electrical device 700 of the present invention. The electrical device 700 is configured to connect to the mounting frame 410. In the depicted embodiment, the electrical device 700 includes a disk drive 210, a connector 220, a device distal end 230, a device proximal end 240, and one or more rail guides 710. Although for clarity purposes the electrical device 700 is depicted as a disk drive 210, other electrical devices including those discussed above may be employed.

The disk drive 210 in the depicted embodiment is provided with a pair of rail guides 710. The rail guides 710 are configured to engage with a mounting mechanism such as mounting rails 630 attached to a mounting frame 410. The rail guides 710 of the electrical device 700 may be inserted and removed from a mounting frame 410 with the use of the mounting rails 630.

In so doing, the rail guides 710 engage the mounting rails 630. The rail guides 710 may transition along the mounting rails 630 until the rail guides 710 and the mounting rails 630 are fully engaged. The rail guides 710 help position the disk drive 210 with respect to the distal end 460 of the mounting frame 410. When fully engaged, the connector 220 is connected to the connector 620 of the mounting frame 410.

A wide variety of mounting mechanisms may be deployed in the present invention as will be readily recognized by one of skill in the art. For instance, in one alternative embodiment (not shown) the rail guides 710 are attached to the mounting frame 410 rather than the electrical device 700, and the mounting rails 630 are attached to the electrical device 700 rather than the mounting frame 410.

Figure 8:
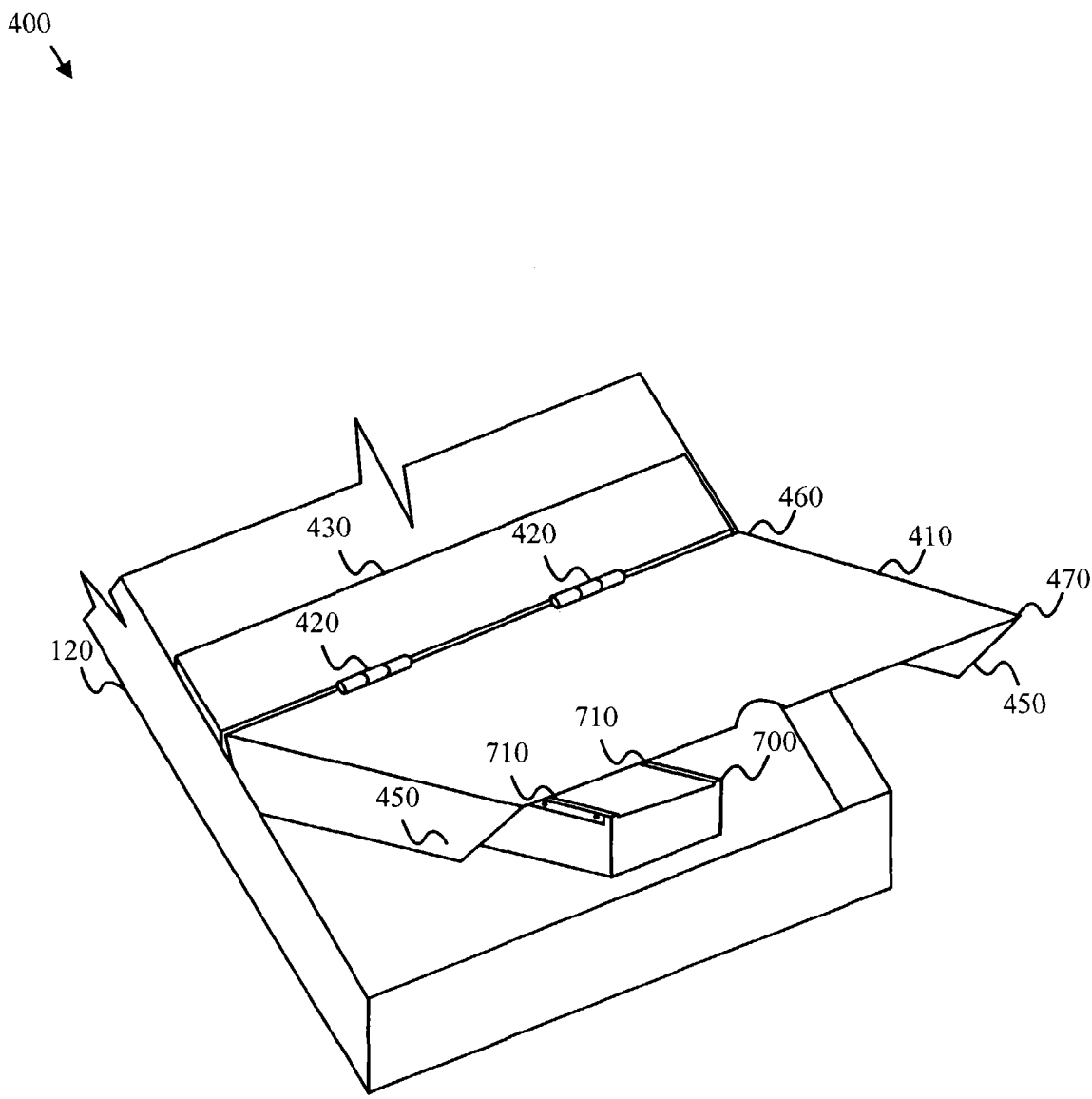
FIG. 8 is a perspective view of one embodiment of a receiving apparatus receiving an electrical device in accordance with the present invention.

FIG. 8 is a perspective view of one embodiment of a receiving apparatus 400 of FIG. 4 receiving an electrical device of the present invention. Although for clarity purposes one mounting frame 410 is depicted in the equipment drawer 120, multiple mounting frames 410 may reside in the equipment drawer 120.

The mounting frame 410 is depicted transitioned to the loading position. The mounting frame 410 disposed in the loading position provides adequate manipulation space adjacent the proximal end 470 of the mounting frame 410. The electrical device 700 is connected to and removed from the proximal end 470 of the mounting frame 410.

The electrical device 700 is depicted partially engaged with the mounting frame 410. The rail guides 710 of the electrical device 700 are partially engaged with the mounting rails 630 of the mounting frame 410. The electrical device 700 transitions along the mounting rails 630 toward the distal end 460 of the mounting frame 410. The electrical device 700 connects with the connector 620 of the mounting frame 410.

Figure 9:
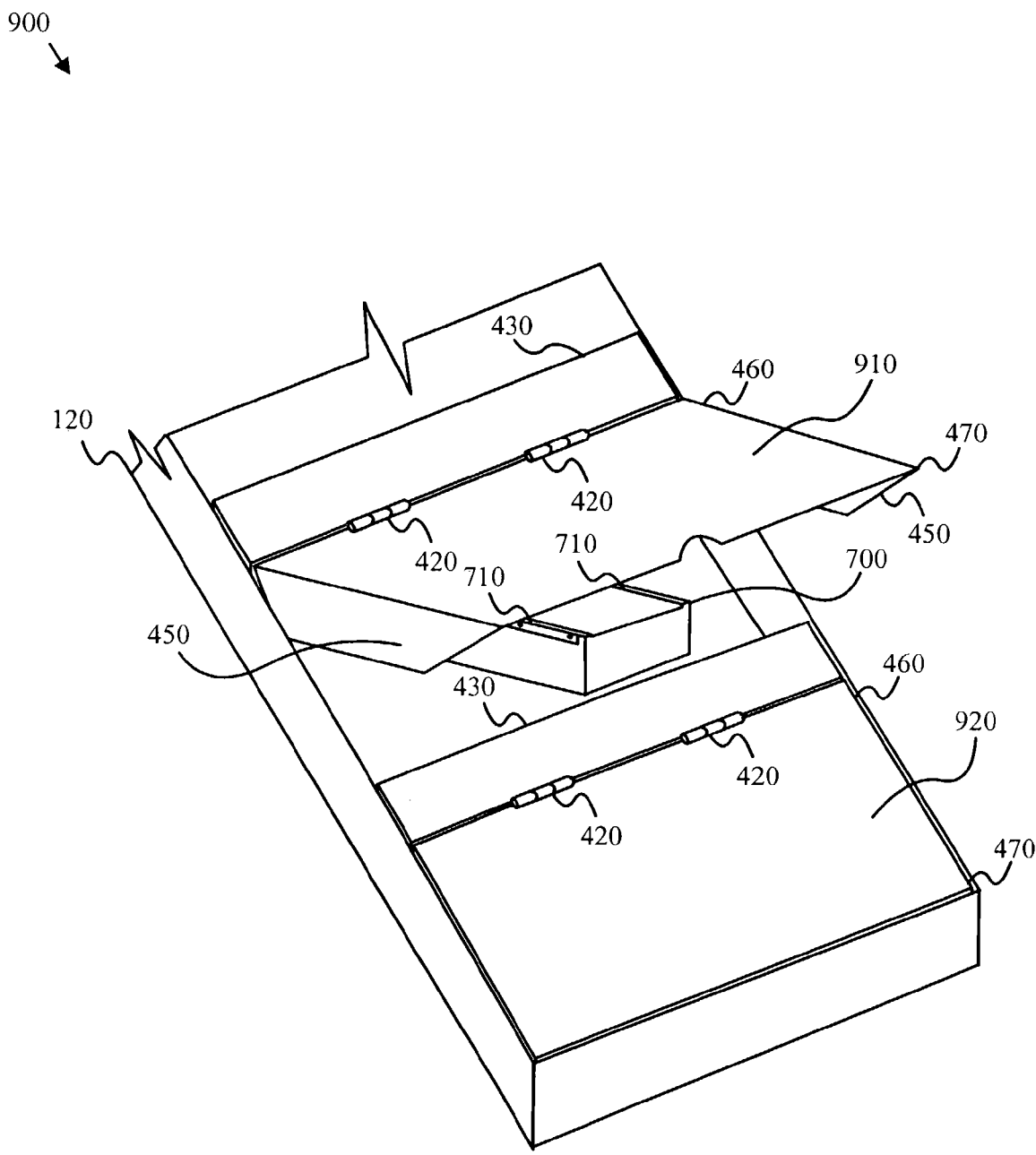
FIG. 9 is a perspective view of an alternate embodiment of a receiving apparatus/electrical device of the present invention.

FIG. 9 is a perspective view of an alternate embodiment of a receiving apparatus 900 receiving an electrical device 700 of the present invention. The receiving apparatus 900 includes one or more mounting frames 910 and 920, one or more movement mechanisms 420, one or more stationary frames 430, one or more side panels 450, one or more mounting frame distal ends 460, one or more mounting frame proximal ends 470, an equipment drawer 120, an electrical device 700, and one or more rail guides 710. Although the equipment drawer 120 is depicted with two mounting frames 910 and 920, additional mounting frames 410 may reside within the equipment drawer 120.

The mounting frame 910 is depicted transitioned to the loading position. The mounting frame 910 is disposed at an angle to the equipment drawer 120. The mounting frame 910 in the loading position provides sufficient manipulation space for the electrical device 700 to be connected and removed. The electrical device 700 may be hot swapped within the mounting frame 910.

The mounting frame 920 is depicted retracted into the operational position. The retracted mounting frame 920 is configured to conform to a standard computer equipment cabinet height requirement such as the heights specified in the Electronic Industries Association standard EIA-310. The retracted mounting frame 920 facilitates a dense array of electrical devices within the equipment drawer 120 with a minimum of manipulation space between the electrical devices 700.

Figure 10:
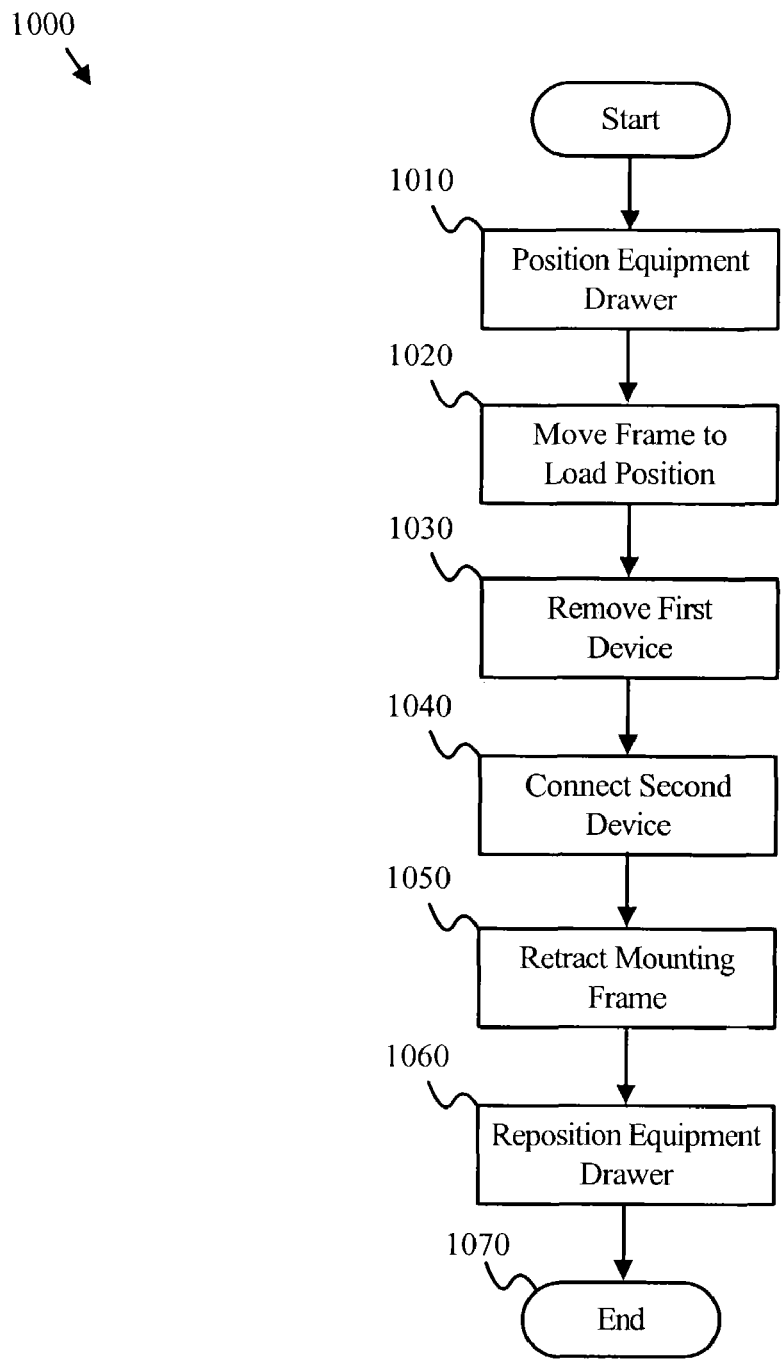
FIG. 10 is a flow chart diagram illustrating one embodiment of a hot swapping method of the present invention.

FIG. 10 is a flow chart illustrating one embodiment of a hot swapping method 1000 of the present invention. The method 1000 provides for a first electrical device 700 to be removed from a mounting frame 410. The method further provides for a second electrical device 700 to be connected to the mounting frame 410. The hot swapping method 1000 includes a position equipment drawer step 1010, a move frame to load position step 1020, a remove first device step 1030, a connect second device step 1040, a retract mounting frame step 1050, a reposition equipment drawer step 1060, and an end step 1070.

In the step 1010, the equipment drawer 120 is positioned. The equipment drawer 120 may extend from the cabinet shell 110. The move frame to load position step 1020 moves a mounting frame 410 to a loading position. Positioning the mounting frame 410 in the loading position exposes an electrical device 700. In the step 1030, a first electrical device 700 is removed from the mounting frame 410. The first electrical device 700 may be removed while the mounting frame 410 connector 620 is active.

In the step 1040, a second electrical device 700 is connected to the connector 620 on the mounting frame 410. The second electrical device 700 may be inserted while the mounting frame 410 connector 620 is active. In the step 1050, the mounting frame 410 is retracted to an operational position.

In the step 1060, the equipment drawer 120 is repositioned to return the equipment drawer 120 to a position within the cabinet shell 110. The end step 1070 terminates the method 1000.

The present invention facilitates housing and accessing an electrical device connected in a dense array within a computer equipment cabinet equipment drawer under the invention. A mounting frame may be moved to a loading position to provide manipulation space for accessing the electrical device. The mounting frame may also be retracted to an operational position to locate the electrical device in a dense array with minimal space between electrical devices. The invention supports a high density of electrical devices within a computer equipment cabinet and supports hot swapping.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims ate to be embraced within their scope.

The invention claimed is:

1. An apparatus for housing and accessing an electrical device, the apparatus comprising:
    an equipment drawer configured with a compartment and a hinge;
    a mounting frame situated within the equipment drawer, the mounting frame configured to swivel on the hinge to mechanically transition between a plurality of functional positions, including a loading position in which the mounting frame is disposed at an angle to the equipment drawer for receiving an electrical device and an operational position in which the mounting frame is flush with the exterior surface of the equipment drawer for the operation of the electrical device; and
    a connector attached to the mounting frame, the connector configured to provide electrical connectivity to the electrical device and to facilitate hot swapping of the electrical device.

2. The apparatus of claim 1, wherein the mounting frame comprises:
    a plate having a distal end and a proximal end, the distal end configured to connect to the equipment drawer by way of the hinge; and
    a mounting rail attached to a face of the plate oriented towards the equipment drawer, the mounting rail further configured to mount the electrical device.

3. The apparatus of claim 1, wherein the equipment drawer is further configured to receive a plurality of mounting frames.

4. The apparatus of claim 1, wherein the mounting frame is further configured with hardware for mounting the electrical device.

5. The apparatus of claim 1, further comprising a backplane panel rigidly attached to the mounting frame.

6. The apparatus of claim 2, wherein the mounting frame in the loading position is configured to receive the electrical device on the mounting rail, the electrical device engaging the mounting rail near the proximal end of the plate and sliding along the mounting rail to connect with the mounting frame electrical connector.

7. The apparatus of claim 5, wherein the connector is disposed on the backplane panel.

8. A hot swapping mounting assembly for placement in an equipment drawer, the mounting assembly comprising:
    a mounting frame situated within an equipment drawer, the mounting frame configured to swivel on a hinge to mechanically transition between a loading position in which the mounting frame is disposed at an angle and an operational position in which the mounting frame is flush with the exterior;
    a mounting rail attached to the mounting frame, the mounting rail configured to receive a mounting guide of an electrical device; and
    a connector attached to the mounting frame, the connector configured to provide electrical connectivity and to facilitate hot swapping.

9. The mounting assembly of claim 8, wherein the mounting frame is further configured to retract within the equipment drawer.

10. An apparatus for housing and accessing an electrical device, the apparatus comprising:
    means for mounting an electrical device;
    means for swiveling the mounting means to mechanically transition between a loading position in which the mounting means is disposed at an angle and an operational position in which the mounting means is flush with the exterior;

means for mechanically connecting the mounting means to the electrical device, the mounting means configured to facilitate hot swapping of the electrical device; and means for electrically connecting the electrical device to the mounting means.

11. A system for housing and accessing an electrical device, the system comprising:

a computer equipment cabinet;

an equipment drawer configured with a compartment and a hinge;

a mounting frame disposed within the equipment drawer and configured to swivel on the hinge to mechanically transition between a loading position in which the mounting frame is disposed at an angle to the equipment drawer for receiving an electrical device and an operational position in which the mounting frame is flush with the exterior surface of the equipment drawer for the operation of the electrical device; and a connector attached to the mounting frame, the connector configured to provide electrical connectivity to the electrical device and to facilitate hot swapping of the electrical device.

12. The system of claim 11, wherein the mounting frame is further configured to retract within the equipment drawer.

13. The system of claim 11, wherein the mounting frame is further configured with a mounting rail for attaching the electrical device.

14. The system of claim 11, wherein the mounting frame is further configured with a backplane panel.

15. A method for hot swapping an electrical device within a computer equipment cabinet, the method comprising:

mechanically swiveling a mounting frame to an angular loading position;

connecting an electrical device to a connector connected to the mounting frame, the connector configured to facilitate hot swapping of the electrical device; and mechanically retracting the mounting frame and the electrical device to flush operational position.

16. The method of claim 15, further comprising removing the electrical device while maintaining the operation of other electrical devices.

17. The method of claim 15, wherein connecting the electrical device is conducted while maintaining the operation of other electrical devices.

* * * * *

UNITED STATES PATENT AND TRADEMARK OFFICE
CERTIFICATE OF CORRECTION

PATENT NO. : 7,038,915 B2
APPLICATION NO. : 10/634273
DATED : May 2, 2006
INVENTOR(S) : Allen King et al.

It is certified that error appears in the above-identified patent and that said Letters Patent is hereby corrected as shown below:

Column 2,
Line 56, "mounting fame" should read --mounting frame--.

Column 2,
Line 62, "swamping" should read --swapping--.

Column 8,
Line 2, "ate" should read --are--.

Signed and Sealed this

Fourteenth Day of November, 2006

JON W. DUDAS
*Director of the United States Patent and Trademark Office*